United States Patent [19]

Riggs et al.

[11] Patent Number: 4,822,991

[45] Date of Patent: Apr. 18, 1989

[54] OPTICALLY SWITCHED MICROWAVE PULSE GENERATOR

[75] Inventors: Robert F. Riggs; Lawrence H. Gilligan; James D. Halsey, all of Charlottesville, Va.

[73] Assignee: Sperry Marine Inc., Charlottesville, Va.

[21] Appl. No.: 118,812

[22] Filed: Nov. 9, 1987

[51] Int. Cl.$^4$ ............................................. H01J 40/14
[52] U.S. Cl. .................................................. 250/211 J
[58] Field of Search ............... 250/211 R, 211 J, 551; 307/311; 357/29, 30 R

[56] References Cited

U.S. PATENT DOCUMENTS

| | | | |
|---|---|---|---|
| 4,135,099 | 1/1979 | Fiedor et al. | 250/551 |
| 4,218,618 | 8/1980 | Mourou | 250/211 J |
| 4,396,833 | 8/1983 | Pan | 357/30 |
| 4,577,114 | 3/1986 | Levy et al. | 250/551 |
| 4,691,111 | 9/1987 | Bovino | 250/551 |
| 4,695,733 | 9/1987 | Pesavento | 250/551 |
| 4,749,850 | 6/1988 | Chemla et al. | 250/211 J |

Primary Examiner—David C. Nelms
Attorney, Agent, or Firm—Seymour Levine

[57] ABSTRACT

A generator of short electromagnetic pulses utilizes a photoconductive switch having metallic strips on a substrate with a gap separation therebetween. A timing circuit provides an electrical signal to the input of the photoconductive switch and a trigger to an optical source causing a short burst of optical energy to illuminate the gap between the metallic strips, thereby causing the photoconductive substrate to provide a low impedance path between the metallic strips and coupling the electrical signal to an output terminal of the photoconductive switch for the duration of the optical pulse. A filter coupled to the output terminal of the switch, via an impedance matching section, selects a signal frequency band for further transmission.

4 Claims, 2 Drawing Sheets

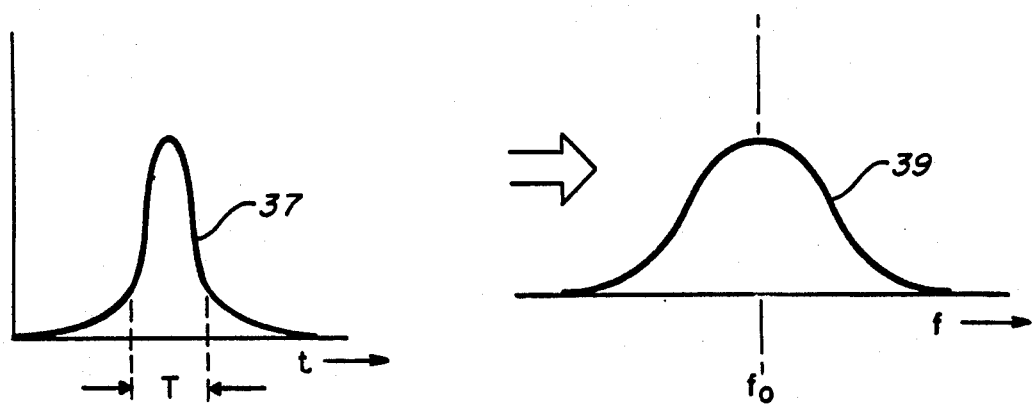
FIG.3a.
FIG.3b.
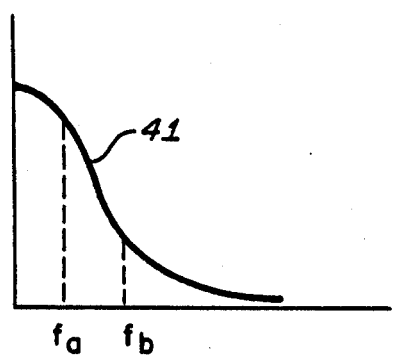
FIG.3c.

OPTICALLY SWITCHED MICROWAVE PULSE GENERATOR

BACKGROUND OF THE INVENTION

1. Field of the Invention

The subject of the invention pertains to the field of short pulse generators and more particularly to short pulse generators capable of providing bursts of microwave energy without the utilization of an active microwave oscillator.

2. Description of the Prior Art

Short baseband pulses of sub-nanosecond duration have bandwidths that extend from d. c. well into the microwave region. A myriad of applications exist for pulses of this sort. In one application they may be utilized in a radar system to provide high range resolution, while in another application the short pulse may be passed through a bank of filters to provide signals at selected frequencies from near d.c. into the gigahertz region.

Early prior art short pulse generators utilized a mercury relay switch to discharge a transmission line which had been charged to a high voltage through a long time constant. This technique is capable of providing sub-nano second pulses with rise times in the order of one hundred picoseconds at peak pulse voltages in the order of several hundred volts. These switches, however, cannot be operated at very high duty cycles because of mechanical limitations of a vibrating reed used therein for the switching operation. Additionally, the mechanical contacts tend to deteriorate, resulting in jittery and noisy pulses. Since the deterioration of the mechanical contacts is proportional to the number of times the contacts are being opened and closed, the life of the switch is inversely proportional to the duty cycle. Another technique employed in the early art utilized Hertzian (spark gap) generators. These devices can supply pulses with amplitudes in the order of one thousand volts and rise times in the order of one hundred picoseconds at repetition frequencies above two hundred hertz. Hertzian generators, however, have a lifetime limited by the width of the spark gap which determines the width of the generated pulse.

More recently short baseband pulses have been generated with the utilization of solid state devices such as tunnel diodes, avalanche transistors, and step-recovery diodes. Nano-second pulses with rise times in the order of twenty-five picoseconds are achievable with tunnel diodes. These generators, however, are low amplitude devices achieving levels only in the order of 0.5 volts. Short pulses with amplitudes as high as one thousand volts have been generated with a series stack of avalanche transistors. The rise and fall times of these generators is in the order of six nanoseconds, which for many applications is too slow. A significant improvement in the pulse rise time has been achieved with the combination of avalanche transistors and step-recovery diodes. These devices exhibit rise times in the order of one hundred picoseconds but provide peak amplitudes only in the order of twenty-five volts.

A short pulse generator in the prior art capable of providing pulse widths of four hundred picoseconds at an amplitude of one hundred volts utilizes a step recovery diode fired by the discharge of three capacitors. The three capacitors are charged in parallel and then, by means of fast switching avalanche transistors, are connected in series for discharge to obtain a voltage that is substantially equal to the sum of the capacitor voltages when charged. The series coupled capacitors are then coupled via an output avalanche transistor to a differentiator causing a doublet pulse to be coupled to the step-recovery diode. This doublet pulse triggers the step-recovery diode stack to provide a fast rise time, high voltage pulse of sub-nanosecond duration. While this device provides high voltage sub-nanosecond pulses, the operation of charging and discharging the capacitors tot rigger the avalanche transistors requires complex circuitry and components of very narrow tolerances to achieve the desired pulse widths.

SUMMARY OF THE INVENTION

A signal generator capable of providing high energy, short pulse electrical signals in accordance with the principles of the present invention may comprise an electrical signal source coupled to a photon-excited solid state switch positioned to receive a short burst of optical energy. Upon the reception of the optical energy the photon-excited solid state switch is activated and passes the signals from the electrical signal source to an output terminal. The photon-excited solid state switch remains activated for the duration of the optical signal and returns to its original state when the optical signal is removed. These photon-excited solid state switches are sensitive to the amplitude of the optical signals, thereby providing electrical signals of an amplitude variation and time duration equal to that of the optical signal.

The short pulse electrical signals at the output of the photon-excited solid state switch may be coupled to a bandpass filter to provide signals at desired center frequency and bandwidth at the output terminals of the bandpass filter.

BRIEF DESCRIPTION OF THE DRAWINGS

FIGS. 3a, 3b and 3c are wave forms useful in explaining the invention.

DESCRIPTION OF THE PREFERRED EMBODIMENTS

Figure 1:
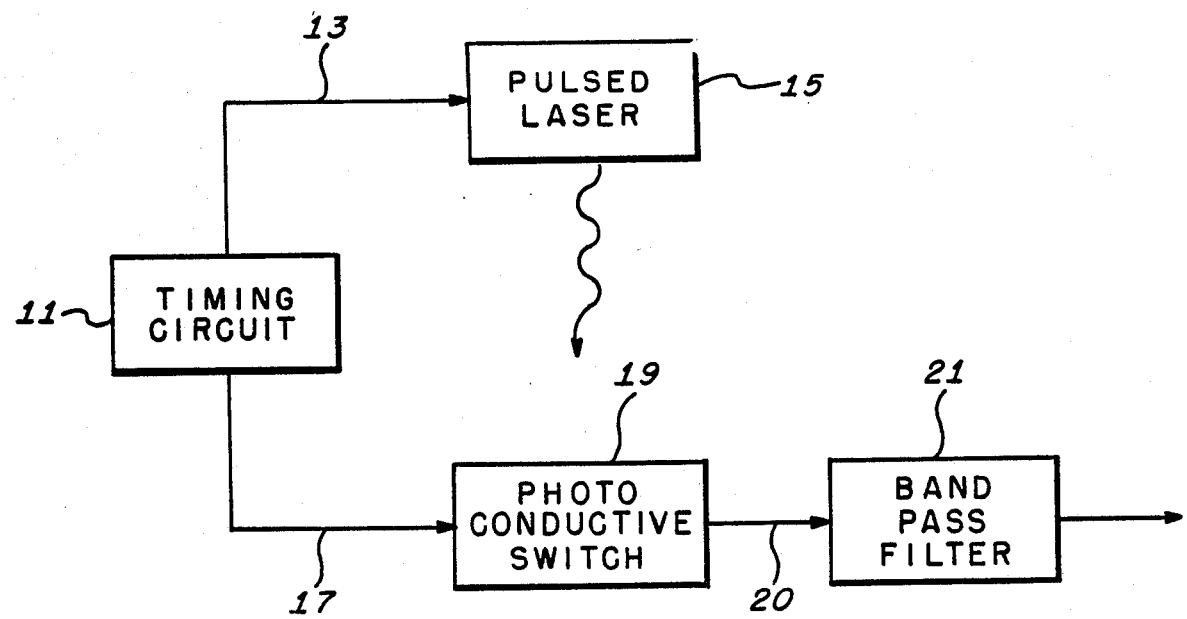
FIG. 1 is a block diagram of preferred embodiment of the invention.

Referring to FIG. 1, a timing circuit 11 generates a pulse which is coupled via line 13 to a laser 15 causing the laser to emit photons for the duration of the pulse. Prior to the generation of the pulse, the timing circuit 11 provides a signal of desired amplitude via line 17 to a photo-conductive switch positioned between the line 17 and an output line 20. The photoconductive switch 19 may be of the suitably doped silicon, gallium arsenide, diamond or indium phosphide type and presents, in the absence of photon illumination, a high impedance between the lines 17 and 20 that approaches an open circuit. When photons of sufficient energy illuminate the switch the electrons in the photo-conductive material are excited into free conduction energy bands, thereby providing a conduction path between the lines 17 and 20 causing the voltage from timing circuit 11 to be coupled through the switch 19 to the input terminals of bandpass filter 21. The photo conductive switch 19 reacts with sufficient rapidity to follow the photon pulse emitted by the laser 15. Sometime after the coupling of the pulse to the line 13, timing circuit 11 terminates the voltage coupled to the photo-conductive switch, thus reducing ohmic heating of the switch substrate and thereby preventing thermal runaway.

The photo-conductive switch 19 is constructed to match the impedance of the termination at the output port of the switch. Thus, the output port of the photo-conductive switch 19 is constructed to provide an impedance matched to the transmission line type utilized by the bandpass filter 21.

Figure 2:
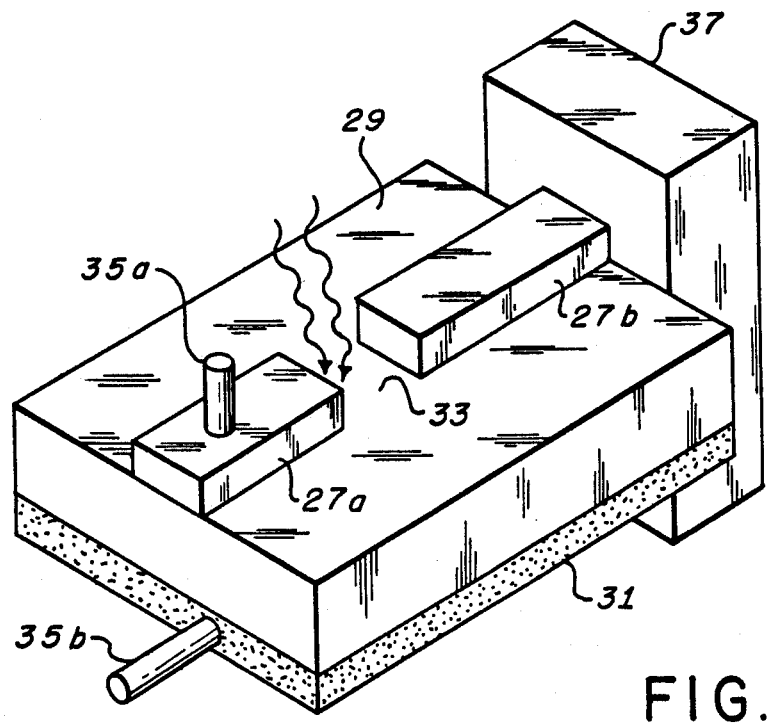
FIG. 2 is an isometric drawing of a configuration for the embodiment of FIG. 1.

Referring to FIG. 2 wherein an isometric view of an embodiment of the invention is shown. In this configuration the switch comprises a microstrip transmission line formed by metallic strips 27a and 27b positioned on an iron doped indium phosphide substrate 29 which is backed by a conducting ground plane 31. A gap 33 between the metallic strips 27a and 27b is located to receive protons from the laser source 15 not shown in this figure. Electrodes 35a and 35b extend from the metallic the strip 27a and from the ground plane 31, respectively, for coupling to the voltage source in the timing circuit 11. When the gap 33 is illuminated by photons from the laser 15, this signal is coupled via strip 27b and matching section 37, to the filter 21, not shown in FIG. 2. The width of the gap 33 is an important variable in the design of the pulse generator. High energy pulses require a high voltage across the gap and the gap width must be sufficient to prevent dielectric breakdown (arcing) across the gap. It should be recognized, however, that the optical energy required to affect photo induced conductivity is directly proportional to the gap width. Thus it is apparent that the transmission of high-peak energy pulses require a high voltage signal source and a relatively high energy optical source.

The shape and length of the pulse at the output port of the filter is a function of a number of factors, including the shape of the optical pulse provided by the laser and the frequency response of the filter. For example, an optical pulse exhibiting a Gaussian envelope and a filter with a rectangular frequency response of sufficient bandwidth provides signals within a frequency band having an amplitude distribution with frequency that is also Gaussian. In FIG. 3a an optical pulse 37 with a Gaussian amplitude function of time is shown. This function has a Fourier transmform which provides signals with a Gaussian amplitude distribution 39 in the frequency domain, as shown in FIG. 3b. If the signal coupled across terminals 35a and 35b is a D. C. Signal, the frequency $f_o$ is 0 and in a one-side Fourier transform results, exhibiting a Gaussian amplitude distribution with frequency extending from D. C., as indicated by the amplitude distribution 41 in FIG. 3c.

A filter with a square frequency response transmits signals coupled thereto, within its frequency band, without varying the amplitude distribution of the coupled signals. Thus a truncated band of frequencies, coupled to the input terminal of the filter, exhibiting a Gaussian amplitude distribution over a frequency range only within the passband of the filter will emerge therefrom with the same truncated Gaussian distribution. When the bandwidth of the filter is between $f_a$ and $f_b$ as shown in FIG. 3c the signals emerging therefrom will have an amplitude distribution over that portion of the Gaussian envelope within the frequency band. In order to provide the maximum energy within the frequency band $f_b - f_a$ at the output terminals of the filter, the pulse length T of the Gaussian optical pulse is chosen to maximize the integrated energy within the filter passband.

While the invention has been described in its preferred embodiments it is to be understood that the words which have been used are words of description rather than of limitation and that changes within the purview of the appended claims may be made without departure from the true scope and spirit of the invention in its broader aspects.

We claim:

1. A radio frequency signal generator comprising:
    means for providing a pulse of optical energy in response to an electrical trigger signal;
    electrical signal means for providing an electrical trigger signal of predetermined duration to said optical energy means, thereby causing an optical energy pulse of said predetermined duration, and for providing a constant amplitude electrical signal commencing at a time prior to commencement of said electrical trigger signal and terminating at a time after termination of said electrical trigger signal;
    light energy sensitive means coupled to receive said constant amplitude electrical signal and positioned to be illuminated by said pulse of optical energy for coupling said electrical signal to an output port for a time interval equal to said predetermined duration of said pulse of optical energy; and
    filter means coupled to said output port for providing an alternating current electrical signal having a preselected center frequency and a predetermined bandwidth.

2. A radio frequency signal generator in accordance with claim 1 wherein said light energy sensitive means comprises:
    a substrate constructed of a photon excited solid state material;
    a first metallic strip coupled to said electrical signal means; and
    a second metallic strip coupled to said output port;
    said first and second metallic strips positioned on said substrate with a gap of predetermined length therebetween, said gap being positioned to receive said pulses of optical energy, said substrate providing a high electrical impedance across said gap when not illuminated with optical energy and a low electrical impedance when illuminated, thereby coupling said constant amplitude electrical signal to said output port for said predetermined duration of said optical energy.

3. A radio frequency signal generator in accordance with claim 2 wherein said filter means is constructed such that said center frequency is a microwave frequency.

4. A radio frequency signal generator in accordance with claim 3 wherein said photo excited solid state material is iron doped indium phosphide.

* * * * *